United States Patent
Kim et al.

[11] Patent Number: 5,881,068
[45] Date of Patent: Mar. 9, 1999

[54] DECODE REGISTER WITH SCAN FUNCTIONALITY

[75] Inventors: Song C. Kim, Santa Clara; James Kaku, Palo Alto; Ken Shin, Castro Valley, all of Calif.

[73] Assignee: Sun Microsystems, Inc., Mountain View, Calif.

[21] Appl. No.: 882,664

[22] Filed: Jun. 25, 1997

[51] Int. Cl.$^6$ ............................................... G06F 11/00
[52] U.S. Cl. ......................................................... 371/22.31
[58] Field of Search .............................. 371/22.31, 22.32, 371/22.34, 22.36; 398/183.06

[56] References Cited

U.S. PATENT DOCUMENTS 5,796,623  8/1998  Butts et al. .............................. 364/489
5,796,995  8/1998  Nasserbakht et al. ................... 395/558

*Primary Examiner*—Vincent P. Canney
*Attorney, Agent, or Firm*—Conley, Rose & Tayon, PC; B. Noel Kivlin

[57] ABSTRACT

A decode register which receives a first plurality of input lines. If the decode register is not in a scan mode during a given clock cycle, the decode register is configured to convey a decoded output value in response to an input value conveyed on the first plurality of input lines. The decode register also includes a scan decode unit, which receives a second plurality of input lines. When operating in scan mode during a given clock cycle, the decode register is configured to convey a second decoded output value in response to a second input value conveyed on the second plurality of input lines. The second plurality of input lines comprise a scan input line and one or more feedback lines which each correspond to a value on the scan input line during a previous clock cycle. The decode register also includes an encoder which is configured to receive a value indicative of the second decoded output value. In response to receiving the decoded input value, the encoder is configured to convey a corresponding encoded output value on a scan output line and the one or more feedback lines. The encoder implements a serial shift function for the scan input of the decode register. In this manner, a single scan input bit may be used to test each of a plurality of output lines while ensuring only one output line is active at a time. Additionally, with only a single logic stage, the decode register exhibits reduced propagation delay.

23 Claims, 10 Drawing Sheets

DECODE REGISTER WITH SCAN FUNCTIONALITY

BACKGROUND OF THE INVENTION

1. Field of the Invention

The present invention relates to the field of circuit design and, more particularly, to a decode register with scan functionality.

2. Description of the Related Art

One common operation performed by digital circuits is decoding. For example, combinations of high and low logic states on three input address lines conveyed to a memory unit may control up to eight output word lines via a decoder circuit. To add greater functionality, the decoder circuit may select from two or more inputs through the use of a multiplexer, as shown in FIG. 1A, which depicts a decoder circuit 100.

As illustrated, decoder circuit 100 includes registers 110A, which each receive one of three data in lines 102A and clock signal 112. Decoder circuit 100 further includes registers 110B, which each receive one of three data in lines 102B as well as clock signal 112. The outputs of registers 110A–B are conveyed to a multiplexer 120, which also receives select signal 104. The output of multiplexer 120 is conveyed to decode logic block 130, which performs a 3:8 decode function. One of the eight signals of decoded output bus 132 is thereby asserted as the output of decoder circuit 100 in response to the logic states of the three input signals.

One disadvantage of decoder circuit 100 is the large "clock-to-Q" delay. That is, while the setup time for decoder circuit 100 is minimal, the inputs signals 102 must propagate through three stages of logic to reach the output, decoded output bus 132, thereby increasing delay.

Turning now to FIG. 1B, a decoder circuit 140 is depicted. Decoder circuit 140 includes several logic blocks similar in function to those pictured in FIG. 1A, and are thus numbered identically. As shown, decoder circuit includes multiplexer 120, which selects between data in signals 102A–B based on the value of select signal 104. The output of multiplexer 120 is conveyed to decode logic 130, which performs a 3:8 decode function. The output of decode logic 130 is coupled to registers 110C, which convey output upon decoded output bus 132.

While decoder circuit 140 has reduced clock-to-Q delay with respect to circuit 100, the setup time has increased, thus maintaining a similar propagation delay. Another disadvantage of decoder circuit 140 is incorporating scan functionality. Scan functionality is included in logic circuits such as decoder circuit 140 in order to increase testability. In a scan mode, a number of devices (such as each of registers 110C) are coupled by connecting a scan output of one device to a scan input signal of another, forming a serial "scan chain". A bit stream is then clocked into a given scan chain while in scan mode, setting the corresponding logic devices into a desired state. A system clock is applied, causing the logic circuits to evaluate the data at their inputs. The resulting bit stream is then scanned out to check for proper operation.

Testing decoded output bus 132 within decoder circuit 140 in scan mode requires a number of scan bits equal to the number of register values driven on the bus (in this particular embodiment, eight). In order to test a particular decoded output bus signal 132, a particular bit sequence is first scanned in which specifies one of the eight output lines. Next, a system clock is applied, causing the chosen output line to be activated. Another scan chain may be evaluated to check the results.

Certain circuits require that scan in values be controlled such that only one signal on the output bus is active at any time. One example is a memory decoder which receives addresses and selects one of a plurality of word lines as a result. For proper operation of a memory array, only one word line at a given time may be activated. If more than one word line is active, incorrect data may be returned (or damage to the memory array may result).

The configuration of decoder circuit 140 does not insure that only one signal of decoded output bus 132 is active at a given time, however. Consider the case in which the eight-bit scan string of decoder circuit 140 is part of a larger scan chain. It may be necessary to scan particular values (e.g., two consecutive 1's) through circuit 140 to subsequent scan chain locations such that these values would cause two or more signals on decoded output bus 132 to be active during a given cycle. The reliability and testability of circuit 140 are thus compromised.

A faster decode register which performs a scan function that does not allow more than one output active at a time is therefore desirable.

SUMMARY OF THE INVENTION

The problems outlined above are in large part solved by a decode register in accordance with the present invention. In one embodiment, a decode register is provided which receives a first plurality of input lines. If the decode register is not in a scan mode during a given clock cycle, the decode register is configured to convey a decoded output value in response to an input value conveyed on the first plurality of input lines. The decode register also includes a scan decode unit, which receives a second plurality of input lines. When operating in scan mode during a given clock cycle, the decode register is configured to convey a second decoded output value in response to a second input value conveyed on the second plurality of input lines. The second plurality of input lines comprise a scan input line and one or more feedback lines which each correspond to a value on the scan input line during a previous clock cycle. The decode register also includes an encoder which is configured to receive a value indicative of the second decoded output value. In response to receiving the decoded input value, the encoder is configured to convey a corresponding encoded output value on a scan output line and the one or more feedback lines.

The encoder implements a serial shift function for the scan input of the decode register. In this manner, a single scan input bit may be used to test each of a plurality of output lines while ensuring only one output line is active at a time. Additionally, with only a single logic stage, the decode register exhibits reduced propagation delay.

Broadly speaking, the present invention contemplates a decode register comprising a first decode unit which includes a first plurality of input lines and which is configured to convey a first decoded output value in response to a first input value being conveyed on said first plurality of input lines during a given clock cycle in which the decode register is operating in a normal mode. The decode register further comprises a second decode unit which includes a second plurality of input lines and which is configured to convey a second decoded output value in response to a second input value being conveyed on said second plurality of input lines during a particular clock cycle in which the decode register is operating in a scan mode. The second plurality of input lines includes a scan input line and one or more feedback lines each conveying a respective value. The respective value of each of the one or more feedback lines corresponds to a previous respective value of another of the second plurality of input lines during a previous clock cycle. Finally, the decode register comprises an encoder configured to receive a decoded input value indicative of the second decoded output value. The encoder is configured to generate an encoded output value corresponding to the decoded input value in response to receiving the decoded input value during the particular clock cycle. The encoded output value is conveyed on a scan output line and the one or more feedback lines.

BRIEF DESCRIPTION OF THE DRAWINGS

Other objects and advantages of the invention will become apparent upon reading the following detailed description and upon reference to the accompanying drawings in which.

Figure 1A:
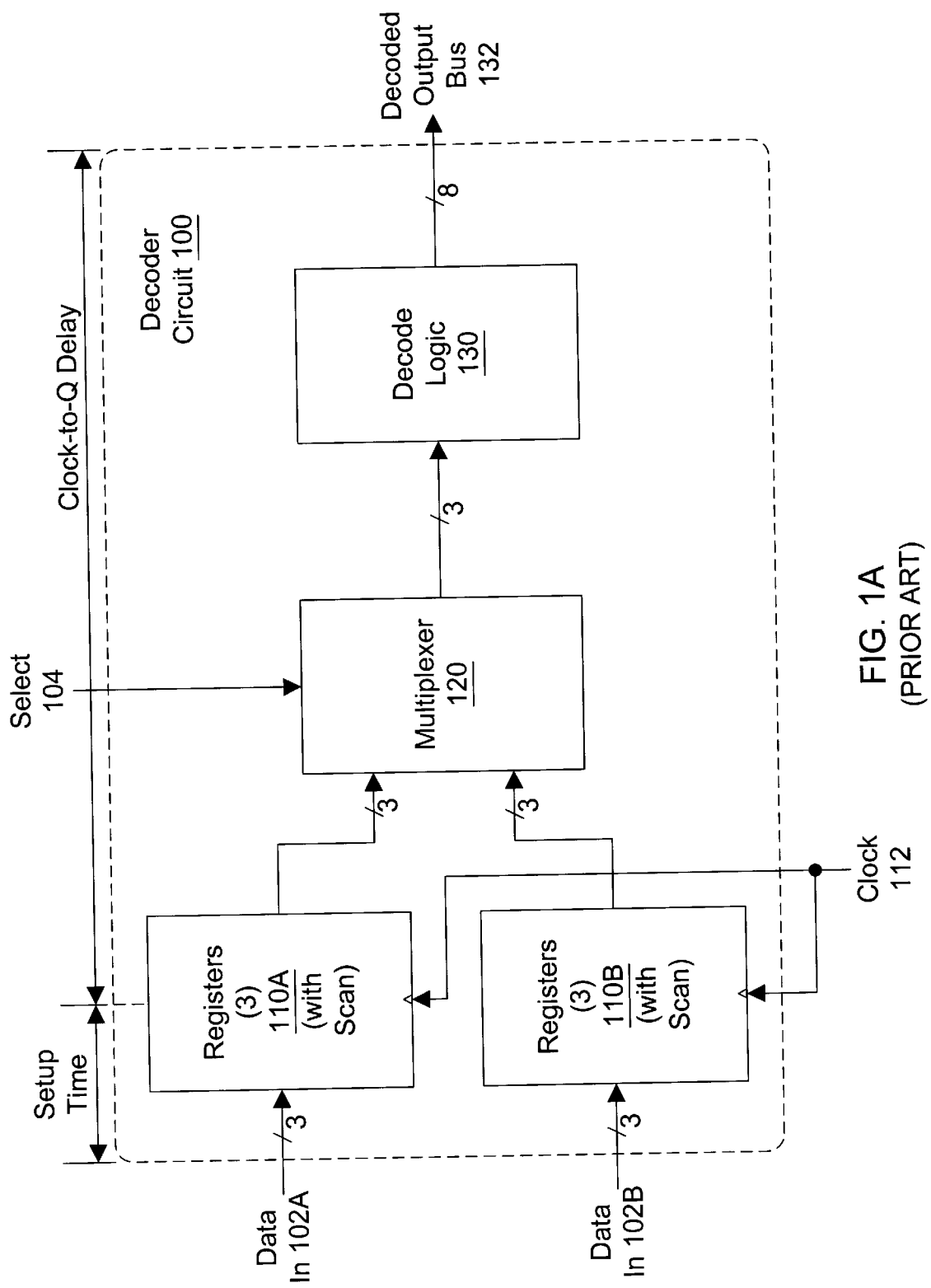
FIGS. 1A–B are block diagrams of typical prior art decode circuits.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

Figure 2:
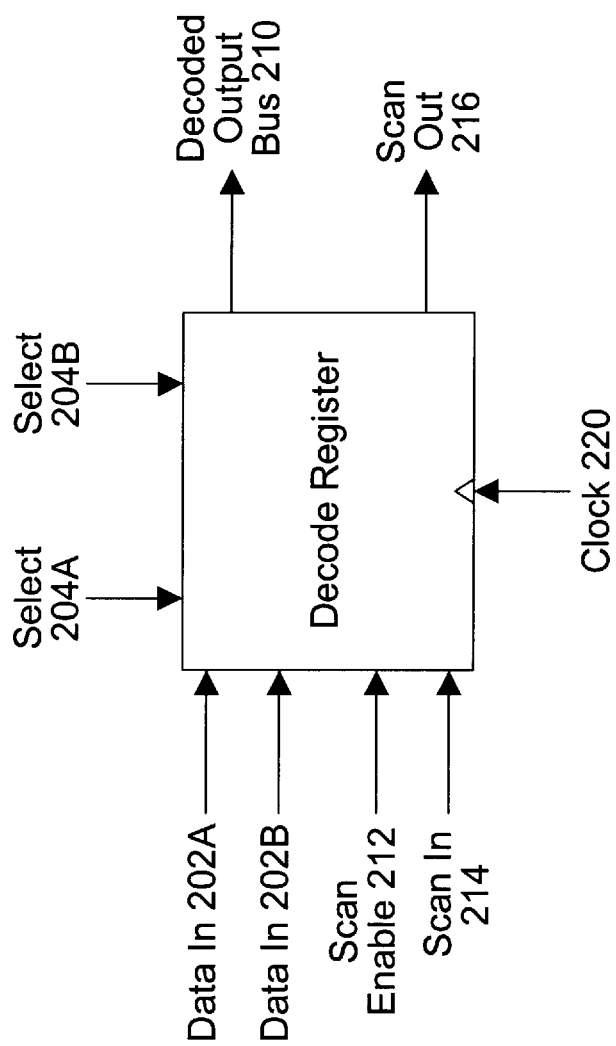
FIG. 2 is a block diagram depicting external connections of one embodiment of a decode register.

Turning now to FIG. 2, a high-level block diagram is shown of one embodiment of a decode register. As depicted, a decode register 200 receives data in signals 202A–B, select signals 204A–B, a scan enable signal 212, a scan in signal 214, and an input clock signal 220, conveying values on a decoded output bus 210 and scan out signal 216 as outputs. Decode register 200 is configured to employ select signals 204 to decode one of two sets of three-signal input buses, data in 202A–B, thereby asserting one of the eight output signals on decoded output bus 210. In other embodiments, a different number of input and outputs line may be implemented, depending on the type of decoder desired.

Figure 1B:
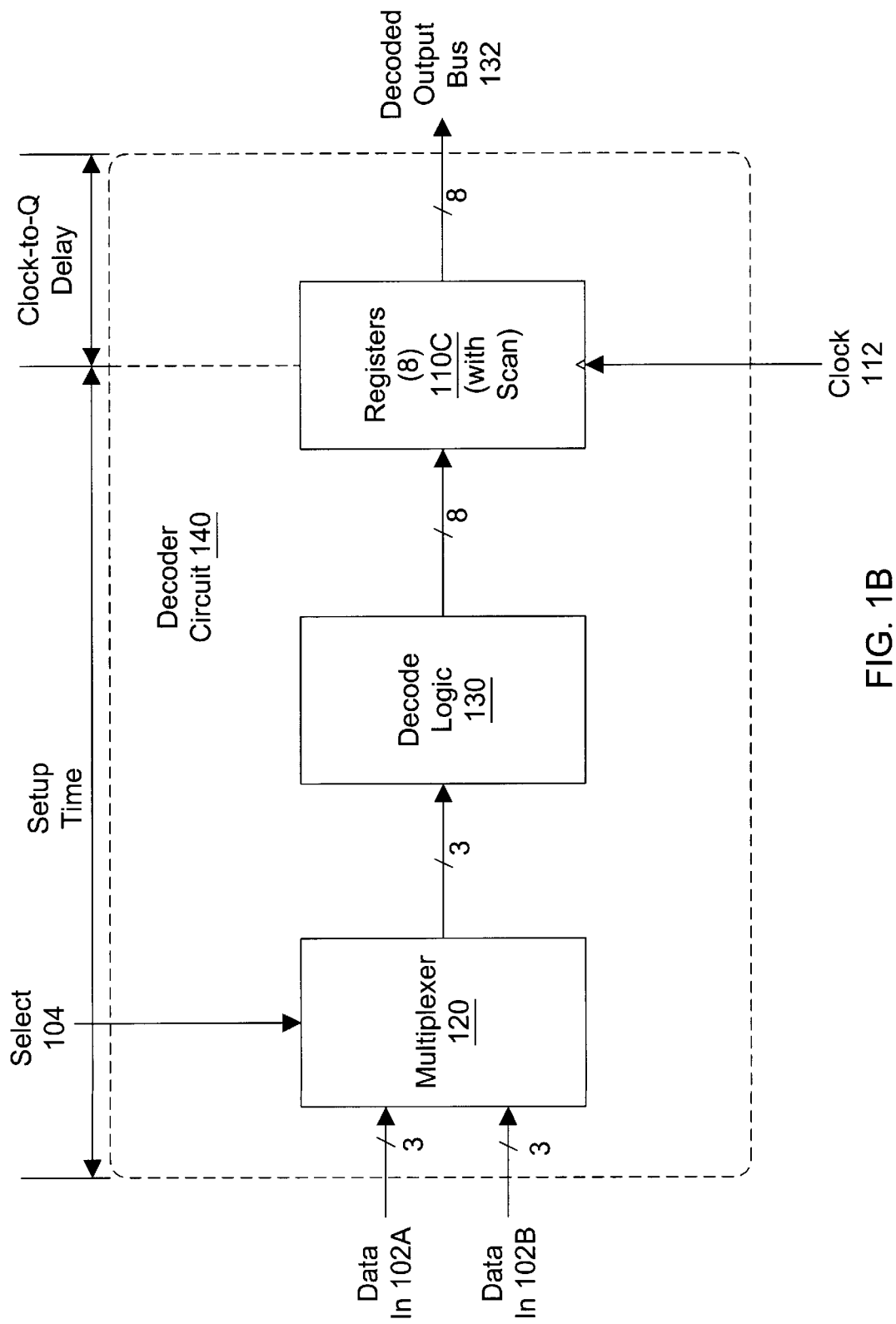

As will be described below, decode register also includes full-scan capability such that all eight output signals may be tested through a single external scan input line, while ensuring only one decoded output at a time is asserted. In contrast to the circuit described with reference to FIG. 1, decode register 200 incorporates the same functionality in a single logic stage, while also incorporating a full-scan capability. Device speed and testability may thus be advantageously increased.

Figure 3:
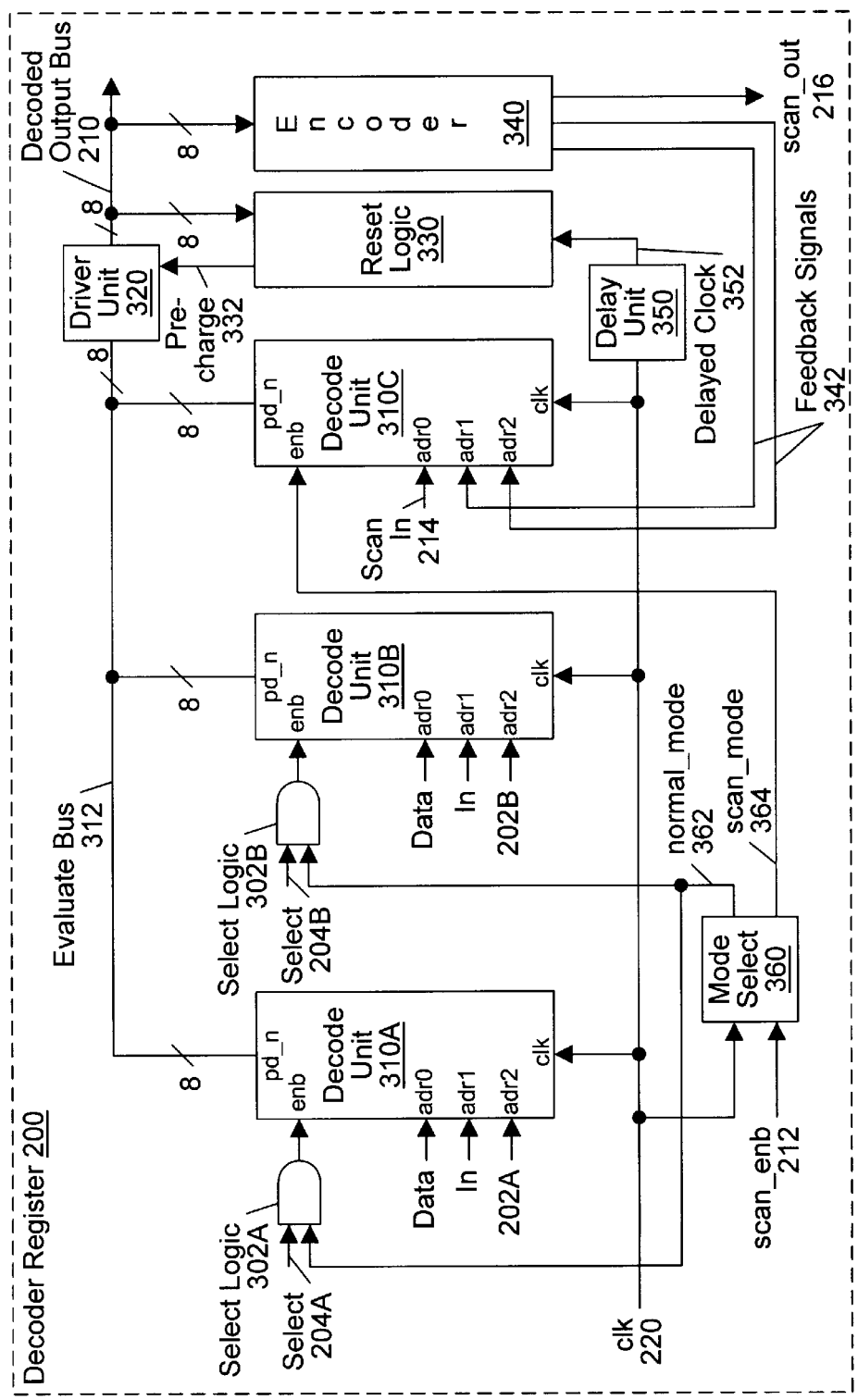
FIG. 3 is a block diagram depicting internal connections of one embodiment of a decode register.

Turning now to FIG. 3, internal connections of one implementation of a decode register are shown. As depicted, decode register 200 includes decode units 310A–C. Decode units 310A and 310B are used for "normal" mode operation (i.e., operation during which scan enable input 212 is inactive). In normal mode, decode register 200 selects from between data in signals 202A and 202B according to enable inputs generated by select logic blocks 302A–B. Select logic blocks 302 assert their respective outputs upon a normal mode select signal 362 (generated by a mode select block 360) and the appropriate select signal 204 being asserted.

Decode unit 310C is used for scan mode operation (i.e., operation during which scan enable input 212 is active). The assertion of scan enable input 212 causes mode select block 360 to activate scan mode signal 364, which is conveyed to the enable input of decode unit 310C. Decode unit 310C receives scan in signal 214 and feedback signals 342 (conveyed from encoder unit 340) as inputs.

In one embodiment, decode register 200 is implemented with dynamic logic to generate a decoded pulse output. A "precharge phase" of the logic in decode register 200 occurs when clock signal 220 is in a logic low state. During this phase, decode units 310A–C charge each node of evaluate bus 312 to a logic high state, while a driver unit 320 discharges each node of decoded output bus 210 to a logic low state. (Decode register 200 is configured such that each decoded output bus 210 signal is the inverted version of a corresponding evaluate bus 312 signal). When a decode unit 310 is selected for operation by the appropriate enable signal, one node of evaluate bus 312 is discharged to a logic low state during an "evaluate phase". In one embodiment, the evaluate phase occurs when clock signal 220 is in a logic high state. In turn, driver unit 320 charges the corresponding signal of decoded output bus 210 to a logic high state. This transition on decoded output bus 210 forms the leading edge of the pulse output of decode register 200.

Decode register 200 also includes a delay unit 350, which generates a delayed version of clock signal 220, delayed clock signal 352, in response to receiving clock signal 220. Delayed clock signal 352 is conveyed to a reset logic unit 330, which also receives the signals of decoded output bus 210. In response to the values of decoded output bus 210 and delayed clock signal 352, reset logic block 330 generates precharge signals 332, which is conveyed to driver unit 320. Driver unit 320 is configured to charge the signals of evaluate bus 312 to a logic high state in response to receiving asserted precharge signals 332. Additionally, driver unit 320 is configured to discharge each of decoded output bus 210 signals to a logic low state in response to precharge signals 332. The assertion of precharge signals 332 thus causes the formation of the trailing edge of the output pulse of decode register 200.

Decode register 200 further includes an encoder unit 340, which is also coupled to decoded output bus 210. As will be described below, encoder unit 340 includes three encoder circuits, each of which receive all eight signals of decoded output bus 210. Each encoder circuit in encoder unit 340 is coupled to the signal of decoded output bus 210 in such a way as to produce a single encoded output bit. Collectively, the three output bits generated by encoder unit 340 correspond to the original three data bits supplied to the selected decode unit 310 in the current clock cycle. Encoder unit 340 thus re-encodes the decoded value represented on decoded output bus 220.

The three data bits generated as the outputs of encoder unit 340 are conveyed on feedback signals 342 and scan out signal 216. Feedback signals 342 are conveyed to two of the data inputs of decode unit 310C, while scan out signal 216 is conveyed as an output of decode register 200. For a given three-bit input to decode unit 310C (to inputs labeled "adr0", "adr1", and "adr2"), encoder unit 340 routes the value of the signal at adr0 in the current clock cycle to the adr1 input for use in the next clock cycle. Similarly, encoder unit 340 routes the value of the signal at adr1 in the current clock cycle to the adr2 input for use in the next clock cycle. The value of the signal conveyed to adr2 in the current clock cycle is conveyed as scan out signal 216. In this manner, encoder 340 implements a serial shift register function: the first bit of a three-bit value conveyed to decode register 200 in successive cycles of clock signal 220 is shifted out of decode register 200 on scan out signal 216 three clock cycles later. The second and third bits of the three-bit value appear on successive cycles.

Figure 4:
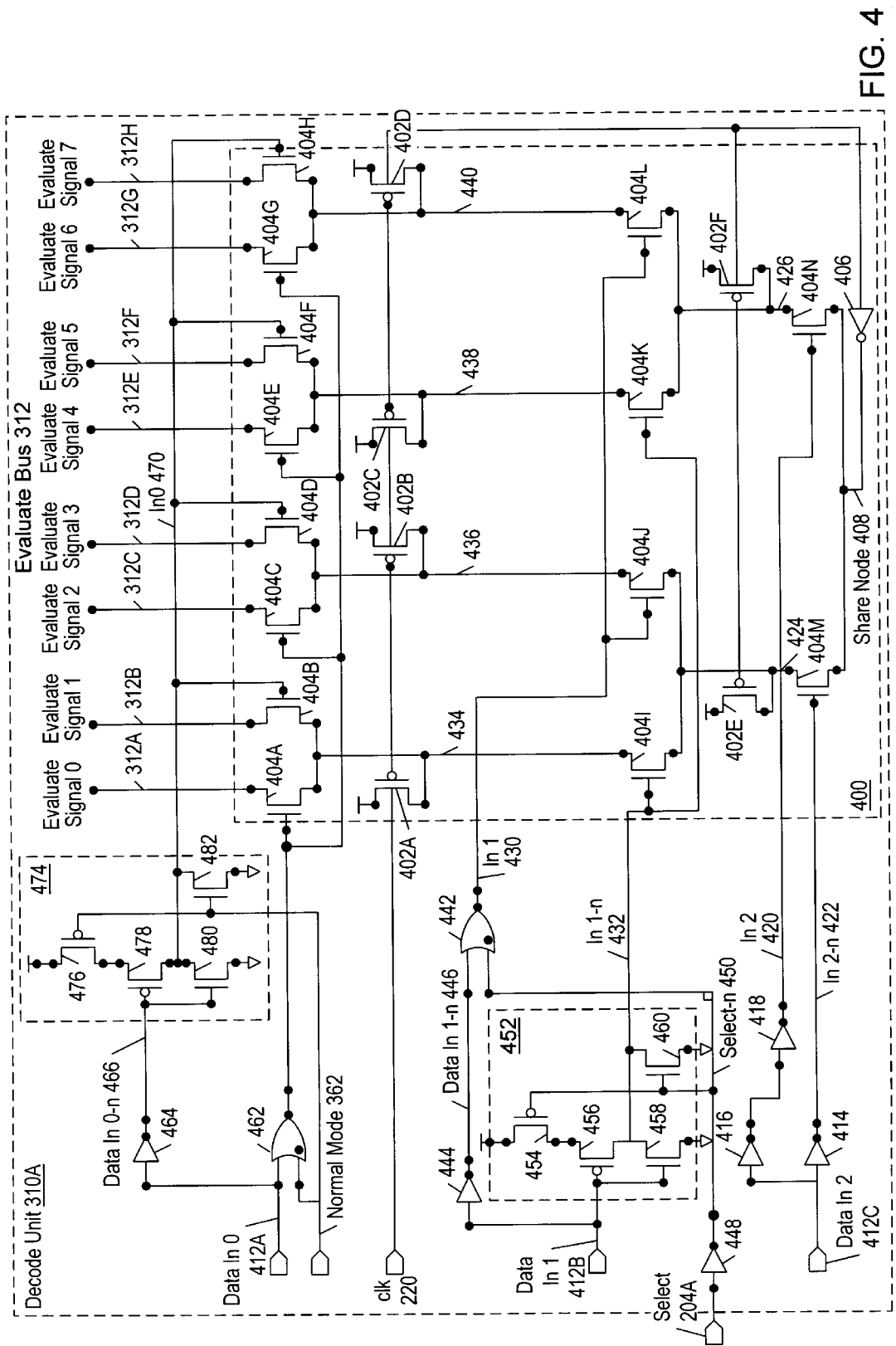
FIG. 4 is a circuit diagram of a decode unit employed in one implementation of a decode register.

Turning now to FIG. 4, a circuit diagram of decode unit 310A in one implementation of decoder register 200 is shown. Decode units 310B–C are similarly configured. Decode unit 310A is implemented as a binary NMOS stack tree 400 in one embodiment. Other decode circuitry may be used in other embodiments.

Decode unit 310A receives clock signal 220, select signal 204A, normal mode signal 362, and data in signals 202A as inputs. In FIG. 4, the three signals of 202A are represented by data in0 signal 412A, data in1 signal 412B, and data in2 signal 412C, respectively. When the appropriate select signals are provided, decode unit 310A discharges one of the eight signals of evaluate bus 312, previously precharged to a logic high state.

During the precharge phase of clock signal 220, a plurality of dynamic nodes within decode unit 310A are precharged to a logic high state. This plurality of dynamic nodes includes a share node 408, evaluate signals 312, as well as nodes 424, 426, 434, 436, 438, and 440. Share node 408 is precharged by clock signal 220 through an inverter 406, while dynamic nodes 424, 426, 434, 436, 438, and 440 are precharged by a plurality of precharge transistors 402A–F. As shown in FIG. 4, each of these precharge transistors (implemented in PMOS in one embodiment) is coupled to a respective dynamic node. For example, precharge transistor 402E is coupled to dynamic node 424, precharge transistor 402F is coupled to dynamic node 426, etc. As will be described below, each signal of evaluate bus 312 is also precharged to a logic high state during the evaluate phase of clock signal 220.

On a rising edge of clock signal 220, share node 408 is driven to a logic low state through inverter 406. If select signal 204A is active and decode register 200 is not in scan mode, one of the eight signals of evaluate bus 312 is discharged to a logic low level in response to the values presented on data in signals 202A. As will be described below, data in signals 202A activate three discharge transistors 404 in such a way as to form a discharge path from share node 408 to one of evaluate signals 312. The discharge path is formed by one discharge transistor 404 in each level of stack tree 400. Different combinations of transistors 404 are turned on and off in accordance with the values on data in lines 202A.

In the first level of binary NMOS stack tree 400, data in2 signal 412C controls the discharge of dynamic nodes 424 and 426. Data in2 signal 412 is conveyed to inverters 414 and 416. The output of inverter 414 is signal in2_n 422, which is conveyed to discharge transistor 404M. The output of inverter 416 is conveyed to an inverter 418, which conveys signal in2 420 to discharge transistor 404N. Therefore, when data in2 signal 412C is active, discharge transistor 404N is turned on and discharge transistor 404M is turned off. Consequently, the evaluate bus signal 312 to be discharged in the current clock cycle is in the half of stack tree 400 controlled by discharge transistor 404N (signals 312E–H). On the other hand, when data in2 signal 412C is inactive, discharge transistor 404M is active and discharge transistor 404N is inactive. In this case, the evaluate bus signal 312 to be discharged in the current clock cycle is in the half of stack tree 400 controlled by discharge transistor 404M (evaluate signals 312A–D).

Dynamic nodes 424 and 426 are coupled to the second level of binary NMOS stack tree 400, which is controlled by data in1 signal 412B and select signal 204A. Data in1 signal 412B is coupled to an inverter 444, as well as to a precharge-inverter 452. The output of inverter 444, data in1_n signal 446, is coupled to a NOR gate 442. Select signal 204A is coupled to an inverter 448, which generates select_n signal 450. Select_n signal 450 is coupled to NOR gate 442 and precharge-inverter 452. The output of precharge-inverter 452 is in1_n signal 432, which is conveyed to discharge transistors 404I and 404K. The output of NOR gate 442, in1 signal 430, is conveyed to discharge transistors 404J and 404L. As in the first level of stack tree 400, half of the discharge transistors 404 in the second level are activated by a logic high value of the data input 412, while the other half are activated by a logic low value.

When select signal 204A is inactive, none of discharge transistors 404I–L are selected. The inactive select signal 204A causes a logic high state to be conveyed on select_n signal 450. The logic high value of select_n signal 450 activates transistor 460, pulling down in1_n signal 432 to ground. Discharge transistors 404I and 404K (which are coupled to in1_n signal 432) are thus not selected. Similarly, select_n signal 450 is also conveyed as an input to NOR gate 442. When select signal 204A is inactive (and select_n signal 450 is active), the output of NOR gate 442, in1 signal 430, is thus a logic low value. Discharge transistors 404J and 404L (which are coupled to in1 signal 430) are thus not selected. Since none of the discharge transistors 404 are selected in the second level of stack tree 400, none of evaluate signals 312 are discharged to a logic low state when select signal 204A is not active.

When select signal 204A is active, however, a logic low value is conveyed to precharge-inverter 452 and NOR gate 442 on select_n signal 450. The logic low value on select_n signal 450 activates pullup transistor 454 and de-activates pulldown transistor 460. Transistors 454, 456, and 458 form an inverter which conveys an inverted value of data in1 signal 412B on in1_n signal 432 when transistor 454 is activated. NOR gate 442 also acts as an inverter when select_n signal 450 is in a logic low state. Since NOR gate 442 receives an inverted version of data in1 signal 412B (data in1_n signal 446), the output of NOR gate 442 when select signal 204A is active is the non-inverted value of data in1 signal 412B.

Thus when data in1 signal 412B is a logic low value, in1_n signal 432 is conveyed as a logic high value, activating discharge transistors 404I and 404K. One of these discharge transistors 404 may be coupled to share node 408 through an activated discharge transistor 404 in the first level of stack tree 400. The logic low value on data in1 signal 412B is also conveyed to inverter 444, which conveys the complement of data in1 signal 412B, data in1_n signal 446, to NOR gate 442. Since one input of NOR gate 442, select_n signal 450, is held at a logic low value, the value of the other input (data in1_n signal 446), is inverted at the output, producing in1 signal 430. So when data in1 signal 412B is at a logic low value, in1 signal 430 is as well. In this case, neither discharge transistor (404J or 404L) controlled by in1 signal 430 is activated.

When data in1 signal 412B is at a logic high value, however, the output of precharge/inverter 452, in1_n signal 432 is conveyed as a logic low value. Discharge transistors 404I and 404K are therefore de-activated. Conversely, the output of NOR gate 442, in1 signal 430, is conveyed as a logic high value. The discharge transistors controlled by in1 signal 430, 404J and 404L, are thus activated.

In the first level of stack tree 400, one of the two discharge transistors 404M and 404N is always activated. In the second level of stack tree 400, however, half of the discharge transistors are activated only if select signal 204A is active. (Correspondingly, only half of dynamic nodes 434, 436, 438, and 440 are discharged if select signal 204A is active). If select signal 204A is inactive, none of the discharge transistors 404 in the second level of stack tree 400 are activated. Consequently, none of evaluate signals 312 are discharged.

The third level of stack tree 400 operates similarly to the first and second levels. If decode register 200 is in normal mode (scan enable signal 212 is inactive), normal mode signal 362 is in a logic low state when clock signal 220 is also in a logic low state. As long as normal mode signal 362 is in a logic low state, discharge transistors 404A–H may be activated in response to data in0 signal 412A. Normal mode signal 362 transitions to a logic high state upon a rising edge of clock signal 220, however. When normal mode signal 362 is in a logic high state, discharge transistors 404A–H become inactive. As will be described below, decode register 200 is configured such that there is a time delay between when clock signal 220 transitions to a logic high state and when normal mode signal 362 transitions to a logic high state in response. During this "window of opportunity", discharge transistors 404A–H may be activated, allowing one of evaluate signals 312 to be discharged.

During the window of opportunity in which normal mode signal 362 is in a logic low state and when clock signal 220 is also in a logic high state, normal mode signal 362 activates precharge-inverter 474, composed of transistors 476, 478, 480, and 482. Normal mode signal 362 also causes NOR gate 462 to act as an inverter for the other input, data in0 signal 412. Precharge-inverter receives data in0_n signal 466 from an inverter 464, and conveys in0 signal 470 as an output. In0 signal 470, which has the same value as data in0 signal 412A, controls discharge transistors 404B, 404D, 404F, and 404H. The output of NOR gate 462, in0_n signal 472, has the complemented value of data in0 signal 412A. In0_n signal 472 controls discharge transistors 404A, 404C, 404E, and 404G. When a discharge transistor 404A–H in the third level of stack tree 400 is activated by either in0 signal 470 or in0_n signal 472, the value at the dynamic node coupled between the transistor and the second level of stack tree 400 is conveyed through the transistor 404 to one of evaluate signals 312.

Consider a given clock cycle in which select signal 204A is active and binary value 010 is present on data in signals 202A (data in0 signal 412A is 0, data in1 signal 412B is 1, data in2 signal 412C is 0). On a rising edge of clock signal 220, share node 408 is discharged to a logic low level. In response to the logic low value on data in2 signal 412C, discharge transistor 404M is activated, causing dynamic node 424 to be discharged. On the other hand, the logic low value on data in2 signal 412C causes discharge transistor 404N to be de-activated. Consequently, none of the evaluate signals 312 connected to the half of stack tree 400 coupled to dynamic node 426 are discharged. Discharged dynamic node 424 is coupled to discharge transistors 404I and 404J. Discharge transistor 404I is turned off in response to the logic high value on data in1 signal 412B, while discharge transistor 404J is turned on. Consequently, dynamic node 436 is discharged, while dynamic node 434 is not. In the third level of stack tree 400, discharged dynamic node 436 is coupled to discharge transistors 404C and 404D. In response to a logic low value on data in0 signal 412A, discharge transistor 404C is activated, while discharge transistor 404D is not. As a result, evaluate signal2 312C is the only one of evaluate bus 312 signals that is discharged in the given clock cycle.

Figure 5:
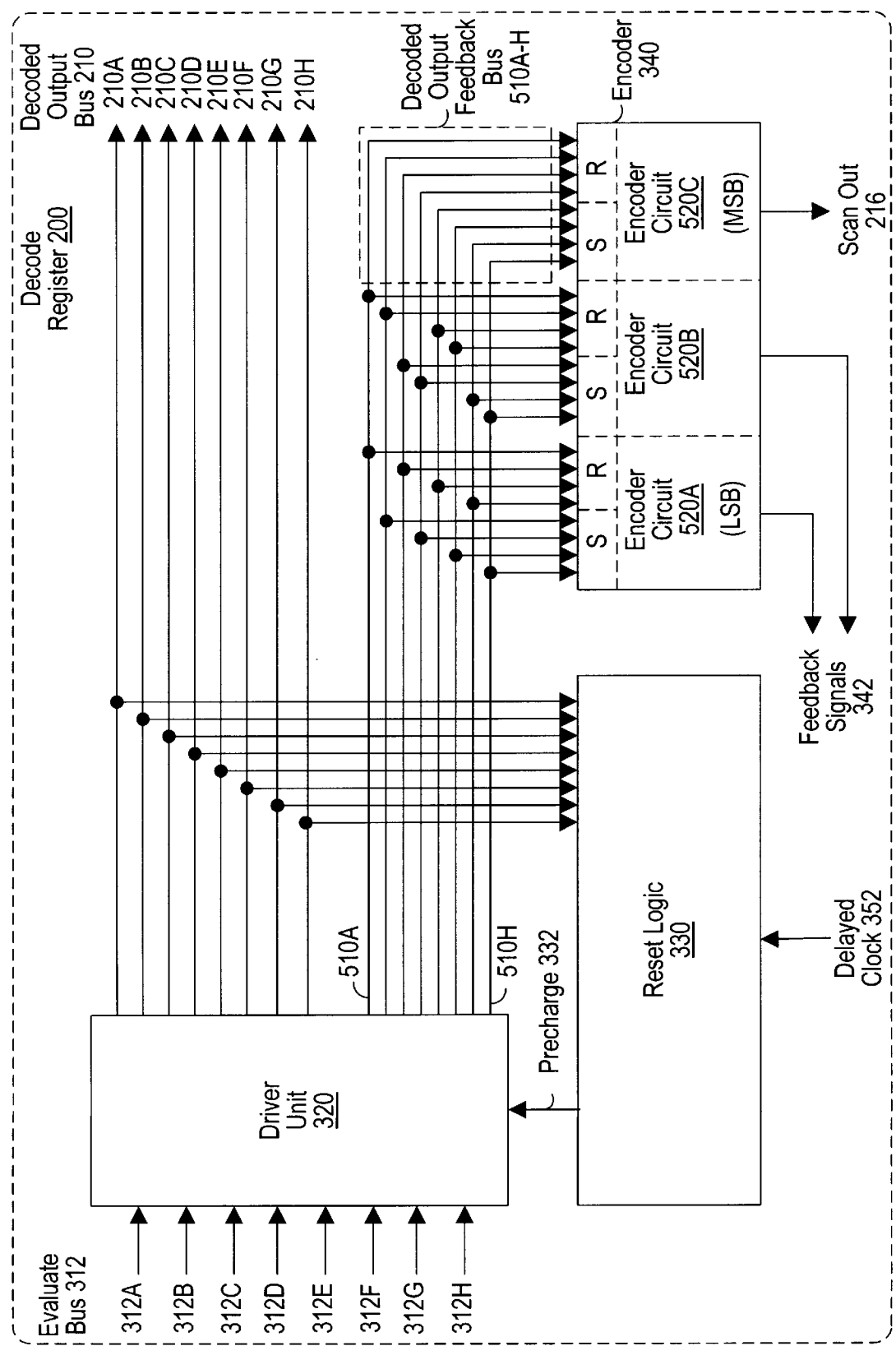
FIG. 5 is a block diagram of a driver unit, reset logic block, and encoder unit employed in one implementation of a decode register.

Turning now to FIG. 5, a block diagram of a driver unit, reset logic block, and encoder unit employed in one implementation of decode register 200 is shown. As depicted, decode register 200 includes driver unit 320, reset logic block 330, and encoder 340. Driver unit 320 receives evaluate bus signals 312A–H as input and conveys decoded output bus 210 (comprising signals 210A–H) and decoded output feedback bus 510 (comprising signals 510A–H) as outputs. Encoder circuits 520A–B receive decoded output feedback bus signals 510 and convey feedback signals 342 to decoder unit 310C, while encoder circuit 520C receives decoded output feedback bus signals 510 and conveys scan out signal 216 as an output of decode register 200. Reset logic block conveys precharge signals 332 in response to receiving delayed clock signal 352.

In response to precharge signals 332 generated by reset logic block 330, driver unit 320 precharges evaluate bus 312 signals to a logic high state and discharges decoded output bus 210 signals to a logic low state during a precharge phase of clock signal 220. As will be shown in reference to FIG. 6, each of decoded output bus 210 signals is generated by inverting one of the evaluate bus 312 signals. Thus, when one of evaluate bus signals 312A–H is discharged during an evaluate phase of clock signal 220, one of decoded output bus signals 210A–H is correspondingly charged.

During the evaluate phase of clock signal 220, the discharged evaluate bus signal 312 and the charged decoded output bus signal 210 remain at logic low and logic high states, respectively, until the assertion of precharge signals 332 by reset logic block 330. Precharge signals 332 are asserted by reset logic block 330 in response to the rising edge of delayed clock signal 352. Because driver unit 320 precharges evaluate signals 312 and discharges decoded output bus signals 210 in response to precharge signals 332, the assertion of precharge signals 332 causes the falling edge of the output pulse of decode register 200 to occur. The width of the output pulse may thus be set by adjusting the amount of time between the rising edge of clock signal 220 and the rising edge of delayed clock signal 352.

In one embodiment, driver unit 320 continues to precharge evaluate bus signals 312 to a logic high state and discharge decoded output bus signals 210 to a logic low state as long as precharge signals 332 are asserted. For this reason, decoded output bus signals 210 are conveyed to reset logic block 330 as feedback. The feedback provided by decoded output bus 210 indicates when the discharging of decoded output bus 210 (and hence, the precharging of evaluate bus 312) is complete. Combinatorial logic within reset logic block 330 then terminates assertion of precharge signals 332.

Figure 6:
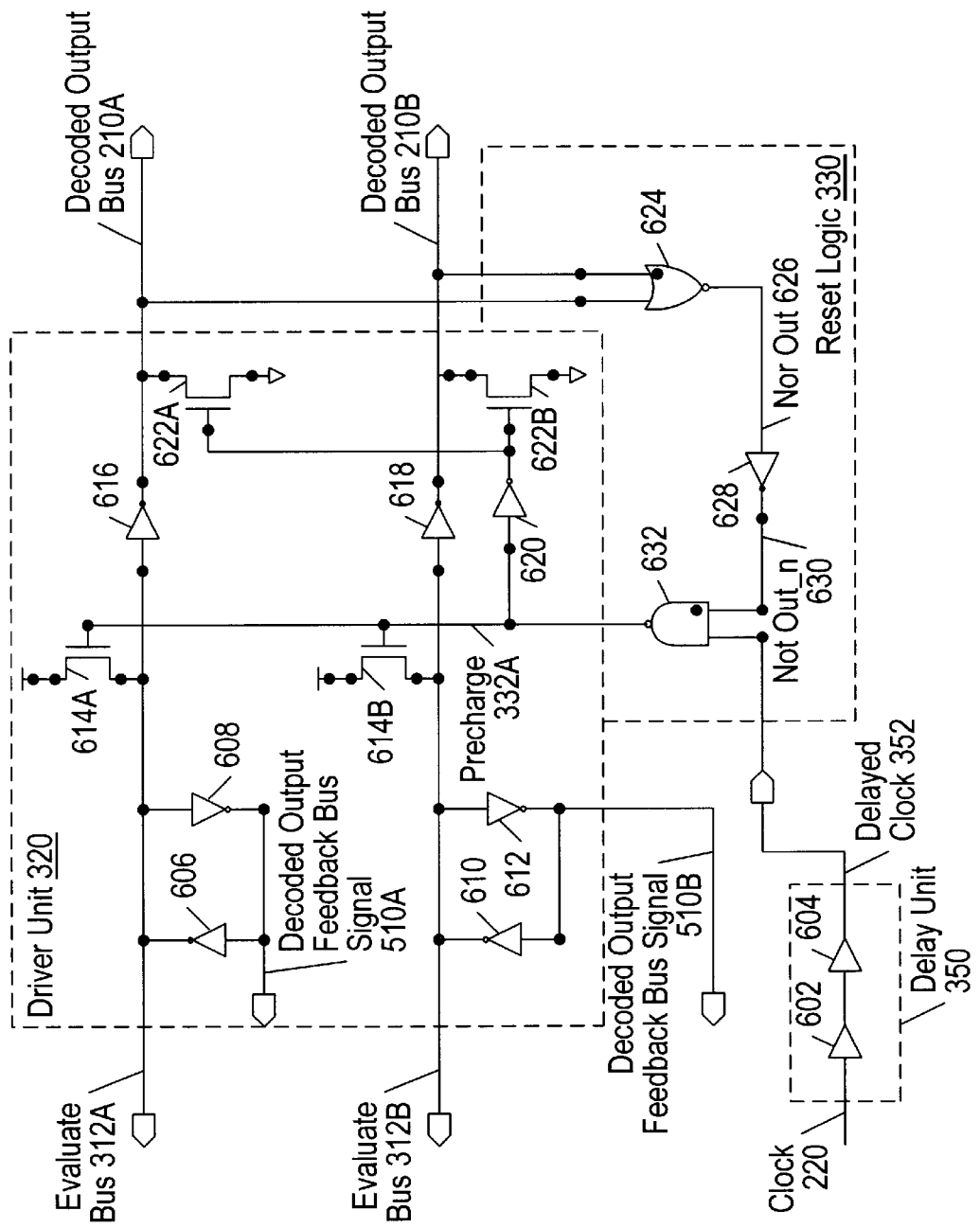
FIG. 6 is a circuit diagram of portions of a driver unit and reset logic block employed in one implementation of a decode register.

As will be shown with reference to FIG. 6, each value on evaluate bus 312 is inverted in driver unit 320 and conveyed as a corresponding signal on decoded output feedback bus 510. The values on decoded output feedback bus 510 are thus the same as the values on decoded output bus 210. While decoded output bus 210 signals are driven as outputs of decode register 200, decoded output feedback bus 510 signals are conveyed to encoder 340 for re-encoding the decoded value on buses 210 and 510.

Encoder 340 includes three encoder circuits 520 which are configured similarly. Each encoder circuit 520 receives as inputs the signals of decoded output feedback bus 510. At most, only one of these signals is asserted during a given clock cycle.

As will be described in reference to FIG. 7, an asserted value (a logic high state in one embodiment) on half of the inputs to one of encoder circuit 520 (those denoted in FIG. 5 as "S") causes a logic high to be conveyed as output. On the other half of inputs to one of encoder circuits 520 (those denoted in FIG. 5 as "R"), an asserted value causes a logic low to be conveyed as output. In decode register 200, three different encoding functions are performed in each of encoder circuits 520 in order to re-encode the value on decoded output feedback bus 510.

Decoded output feedback bus signals 510A–D are conveyed to the "S" (set) inputs of encoder circuit 520C. Similarly, decoded output feedback bus signals 510E–H are conveyed to the "R" (reset) inputs of encoder circuit 520C. The output of encoder circuit 520C, scan out signal 216, thus re-encodes the most significant bit of the input originally provided to one of decode units 310 which produced the current value of decoded output bus 210 and decoded output feedback bus 510. Similarly, encoder circuit 520B re-encodes the next most significant bit of the value on buses 210/510, while encoder circuit 520A re-encodes the least significant bit.

Encoder circuit 340 and feedback signals 342 implement a serial shift function for scan in signal 214. Since decode unit 310C includes three data inputs, a complete scan in value is shifted into decode register 200 over three successive clock cycles. Because this three bit value is conveyed to a 3:8 decoder (decode unit 310C), eight outputs (the signals of decoded output bus 210) may be controlled by through various three-bit scan in values. The least significant bit of decoded output bus 210, 210A, is asserted in response to a scan input value of "000", while the most significant bit of bus 210, 210H, is asserted in response to a scan input value of "111".

Consider a case in which it is desired to assert decoded output bus signal 210D (which corresponds to a input scan string of "011") during scan mode. On a first clock cycle, the most significant bit ("0") of the scan string is conveyed on scan in signal 214 to the least significant input (adr0) of decode unit 310C. One of evaluate signals 312 is discharged in response to the values "xx0" present on the adr2, adr1, and adr0 inputs of decode unit 310C. (The adr2 and adr1 inputs are don't cares in this clock cycle). Correspondingly, one of decoded output bus signals 210 is charged. Encoder 340 receives the values of decoded output bus 210 on decoded output feedback bus 510 and generates the original inputs to decode unit 310C.

The least significant input bit re-encoded by encoder 340 (the "0" conveyed on scan in signal 214) is conveyed to input adr1 of decode unit 310C for use during the next clock cycle. During the next clock cycle, decode unit 310C also receives a new scan in 214 value ("1"). In response to the values "x01" present on the adr2 input, the adr1 input (which is the previous scan in 214 value), and the adr0 input (which is the new scan in 214 value), an evaluate bus signal 312 is discharged. Again, a corresponding signal is charged on both buses 210 and 510, and encoder 340 re-encodes the original input value.

During the next clock cycle, the least significant bit of the scan string ("1") is conveyed on scan in signal 214 to decode unit 310C. During this clock cycle, the most significant bit ("0") of the scan string is present at the adr2 input, while the next most significant bit ("1") is present at the adr1 input. The scan string is thus complete. In response to the values "011" at the adr2, adr1, and adr0 inputs, evaluate bus signal 312D is discharged to a logic low state. Correspondingly, decoded output bus signal 210D is charged to a logic high state. The signals of decoded output bus 210 may thus be controlled by a single input, scan in signal 214. Additionally, only one output of decoded output bus 210 may be active during a given clock cycle.

Turning now to FIG. 6, a circuit diagram of delay unit 350, portions of driver unit 320, and portions of reset logic block 330 is shown for one embodiment of decode register 200. Driver unit 320 also includes similar logic for generating signals 210C–H and 510C–H in response to evaluate bus signals 312C–H. Reset logic 330 also includes additional gates for generating precharge signals 332 corresponding to the signals 312C–H/210C–H.

As depicted, driver unit 320 receives evaluate bus signals 312A–B, and conveys decoded output bus signals 210A–B and decoded output feedback bus signals 510A–B. Delay unit 350 generates delayed clock signal 352 by conveying clock signal 220 through buffers 602 and 604. Although two buffers are shown in delay unit 350, a different number may used in other embodiments depending on the desired amount of delay. Reset logic 330 includes a NAND gate 632, an inverter 628, and a NOR gate 624. NOR gate 624 receives decoded output bus signals 210A–B, and conveys a nor out signal 626 to inverter 628. Inverter 628 conveys a nor out_n signal 630 to NAND gate 632, which also receives delayed clock signal 352. NAND gate 632 conveys precharge signal 332 to driver unit 320.

As described above, evaluate bus 312 is precharged to a logic high state during a precharge phase of clock signal 220. Correspondingly, decoded output bus 210 (including signals 210A–B) is charged to a logic low state during the precharge phase. Upon a rising edge of clock signal 220, however, one of evaluate signals 312 may be discharged if valid input data is presented to decode register 200. Since decoded output bus 210 is coupled to evaluate bus 312 through inverters such as 616 and 618, the discharging of one of evaluate signals 312 causes a corresponding charging of one of decoded output bus signals 210, thereby producing the rising edge of the output pulse of decode register 200.

Additionally, driver unit 320 employs additional inverters to drive decoded output feedback bus signals 510 as well as to re-drive the values on evaluate bus 312. As depicted, decoded output feedback bus signal 510A is conveyed as the output of inverter 608, which receives evaluate bus signal 312A as input. Decoded output feedback bus signal 510A is also conveyed to inverter 606 to re-drive evaluate bus signal 312A. Inverters 610 and 612 perform a similar function for evaluate bus signal 312B.

The falling edge of the output pulse of decode register 200 is caused by the assertion of precharge signals 332, one of which, signal 332A, is shown in FIG. 6. Precharge signal 332A is asserted (to a logic low state) by NAND gate 632 in response to delayed clock signal 352 and nor out_n signal 630 both being in a logic high state. Nor out_n signal 630 is in a logic high state when nor out signal 626 in a logic low state. Nor out signal 626 is in a logic low state unless both decoded output bus signals 210A–B are in a logic low state (indicating bus 210 is already charged).

Because the rising edge of delayed clock signal 352 causes precharge signal 332A to be asserted, the width of the output pulse of decode register 200 may be adjusted by varying the delay between the rising edge of clock signal 220 and the rising edge of delayed clock signal 352. An increased pulse width may be obtained by increasing the amount of delay in delay unit 350.

When precharge signal 332A is asserted to a logic low state, pullup transistors 614A–B are turned on, causing evaluate bus signals 312A–B to be pulled up to a logic high state. Concurrently, precharge signal 332A is conveyed to inverter 620, which activates pulldown transistors 622A–B coupled to decoded output bus 210. In this manner, the falling edge of the output pulse of decode register 200 is produced.

When decoded output bus signals 210A–B are both discharged to a logic low state in response to precharge signal 332A, nor out signal 626 transitions to a logic high state. When nor out signal 626 also becomes a logic high, nor out_n signal 630 transitions to a logic low state. Correspondingly, when nor out_n signal 630 is in a logic low state, precharge signal 332A is de-asserted to a logic high state. Decode register 200 is thus prepared to receive new inputs in a succeeding clock cycle.

Figure 7:
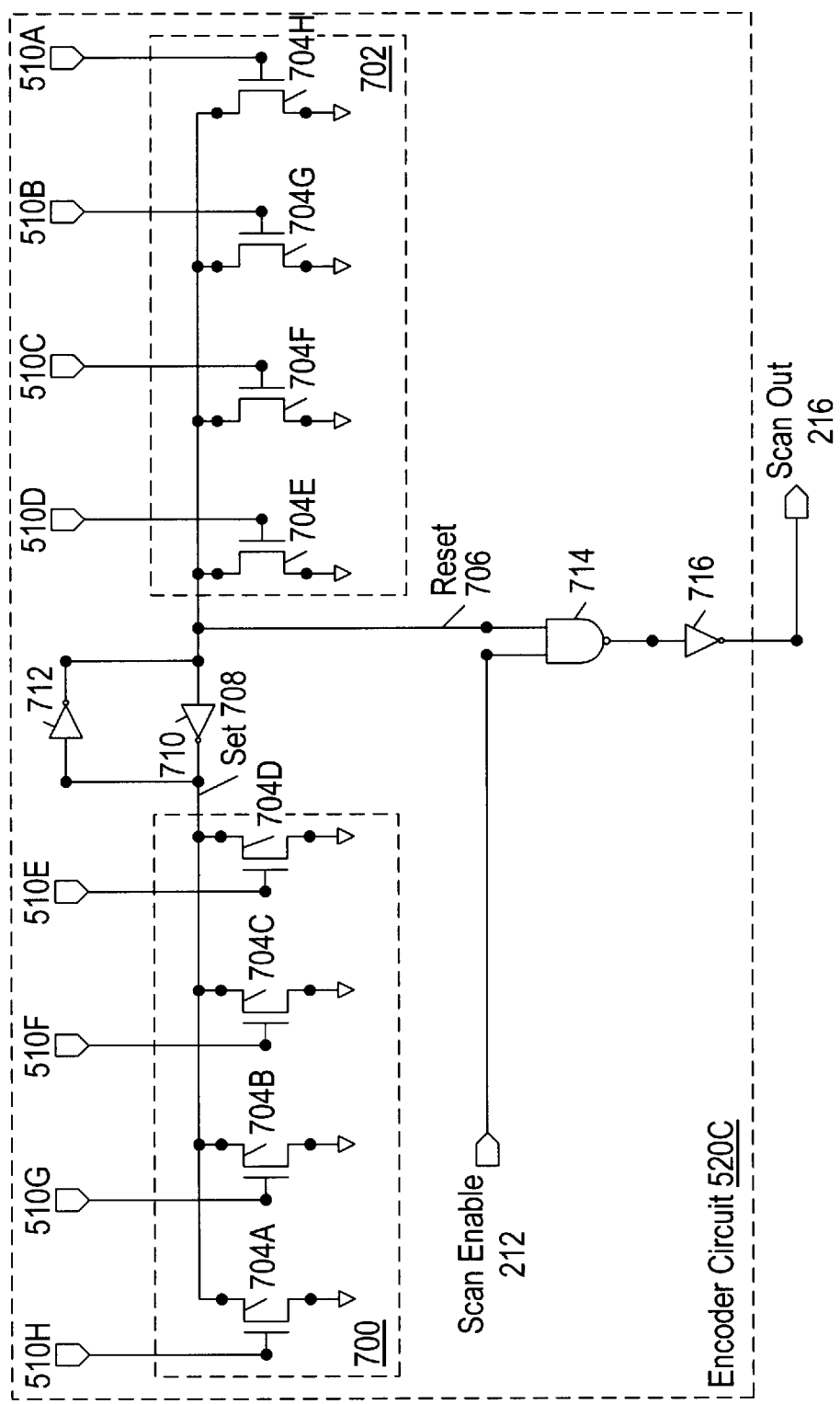
FIG. 7 is a circuit diagram of a encoder unit employed in one implementation of a decode register.

Turning now to FIG. 7, a circuit diagram of encoder circuit 520C is shown. As shown, encoder circuit 520C includes a set unit 700, a reset unit 702, inverters 710 and 712, a NAND gate 714, and an output inverter 716. Encoder circuits 520A–B are configured similarly, although the signals of decoded output feedback bus 510 are routed to the inputs of set unit 700 and reset unit 702 in a different fashion to achieve a different encoding function.

Set unit 700 includes pulldown transistors 704A–D, which are each coupled between set signal 708 and ground. Each transistor 704A–D is activated by a different decoded output feedback bus signal 510. Similarly, reset unit 702 includes pulldown transistors 704E–H, which are coupled between reset signal 706 and ground. Each of pulldown transistors 704E–H is also activated by a different decoded output feedback bus signal 510.

During a given clock cycle, only one of decoded output feedback bus signals 510A–H may be asserted. If the asserted signal is one of inputs to set unit 700 (signals 510E–H), one of pulldown transistors 704A–D is thereby activated, and set signal 708 is pulled to a logic low state. Since none of signals 510A–D are asserted, none of pulldown transistors 704E–H are activated, and reset signal 706 is not pulled to a logic low state. Instead, inverter 712, which is coupled to receive set signal 708 as an input, drives reset signal 706 to a logic high state. If scan enable signal 212 is active, the output of NAND gate 714 is the complement of other input to NAND gate 714, reset signal 706. Thus, if one of decoded output feedback bus signals 510E–H is active along with scan enable signal 212, the output of NAND gate 714 is a logic low value. This value is inverted by output inverter 716 to convey a logic high at output scan out 216.

If scan enable signal 212 is inactive, the output of NAND gate 714 is a logic high value, and the value of scan out signal 216 is therefore a logic low value.

On the other hand, if the asserted signal is one of inputs to reset unit 702 (signals 510A–D), one of pulldown transistors 704E–H is thereby activated, and reset signal 706 is pulled to a logic low state. Since none of signals 510E–H are asserted, none of pulldown transistors 704A–D are activated, and set signal 708 is not pulled to a logic low state via transistors 704A–D. Instead, inverter 710, which is coupled to receive reset signal 706 as an input, drives set signal 708 to a logic high state. With scan enable signal 212 active, the logic low value on reset signal 706 is inverted twice to produce a logic low value on scan out 216.

Figure 8:
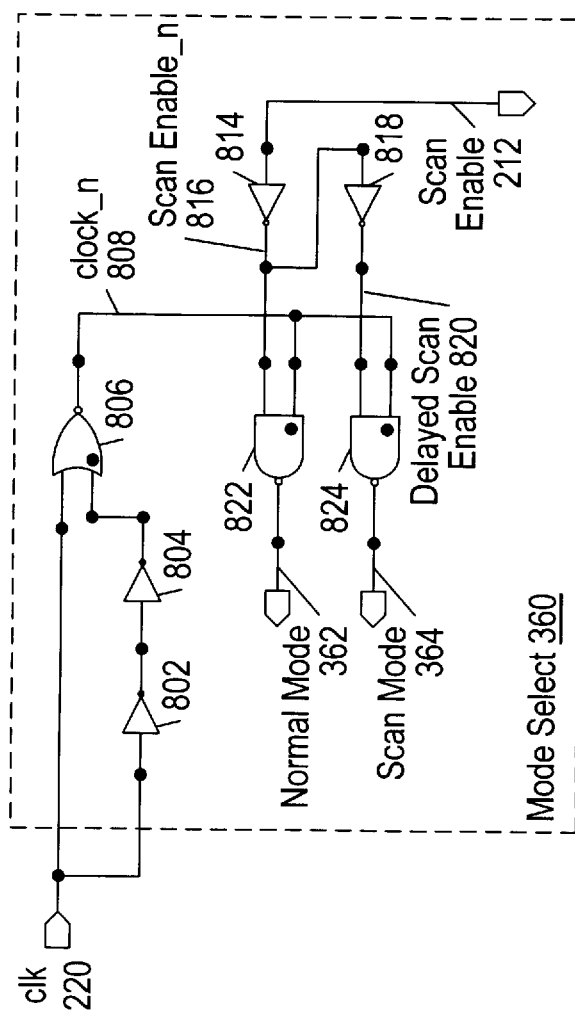
FIG. 8 is a circuit diagram of a mode select block employed in one implementation of a decode register.

Turning now to FIG. 8, a circuit diagram of one implementation of a mode select block 360 within decode register 200 is shown. As depicted, mode select block 360 generates normal mode signal 362 and scan mode signal 364 in response to scan enable signal 212 and clock signal 220.

Clock signal 220 is conveyed to NOR gate 806 and to an inverter 802. The output of inverter 802 is coupled to an inverter 804, which conveys as output a non-inverted version of clock signal 220 to NOR gate 806. NOR gate 806 acts as an inverter since both inputs have the same value, and thus generates clock_n signal 808 as output.

Scan enable signal 212 is conveyed to an inverter 814, which generates a scan enable_n signal 816. Scan enable_n signal 816 is conveyed to a NAND gate 822 and to an inverter 818. Inverter 818 generates a delayed scan enable signal 820, which is an input to a NAND gate 824 along with clock_n signal 808.

Normal mode signal 362 is asserted to a logic low state when both inputs to NAND gate 822, scan enable_n signal 816 and clock_n signal 808, are in a logic high state. If scan enable 212 is asserted, then, normal mode signal 362 is not active. If scan enable 212 is not asserted, however, normal mode signal 362 becomes asserted when clock_n signal 808 is in a logic high state (meaning clock signal 220 is in a logic low state). When clock_n signal 808 transitions to a logic low state on a rising clock signal 230 edge, normal mode signal 362 is de-asserted which inhibits the decoding function of decode units 310A–B. Decode register 200 is configured such that enough of a delay is associated with the active-to-inactive transition of normal mode signal 362 that discharge of one of evaluate bus signals 312 is effected prior to normal mode signal 362 deactivating the enable inputs to either decode unit 310A or 310B. Scan mode signal 364 is asserted (to a logic low state) and de-asserted (to a logic high state) in a similar manner to normal mode signal 362.

Figure 9:
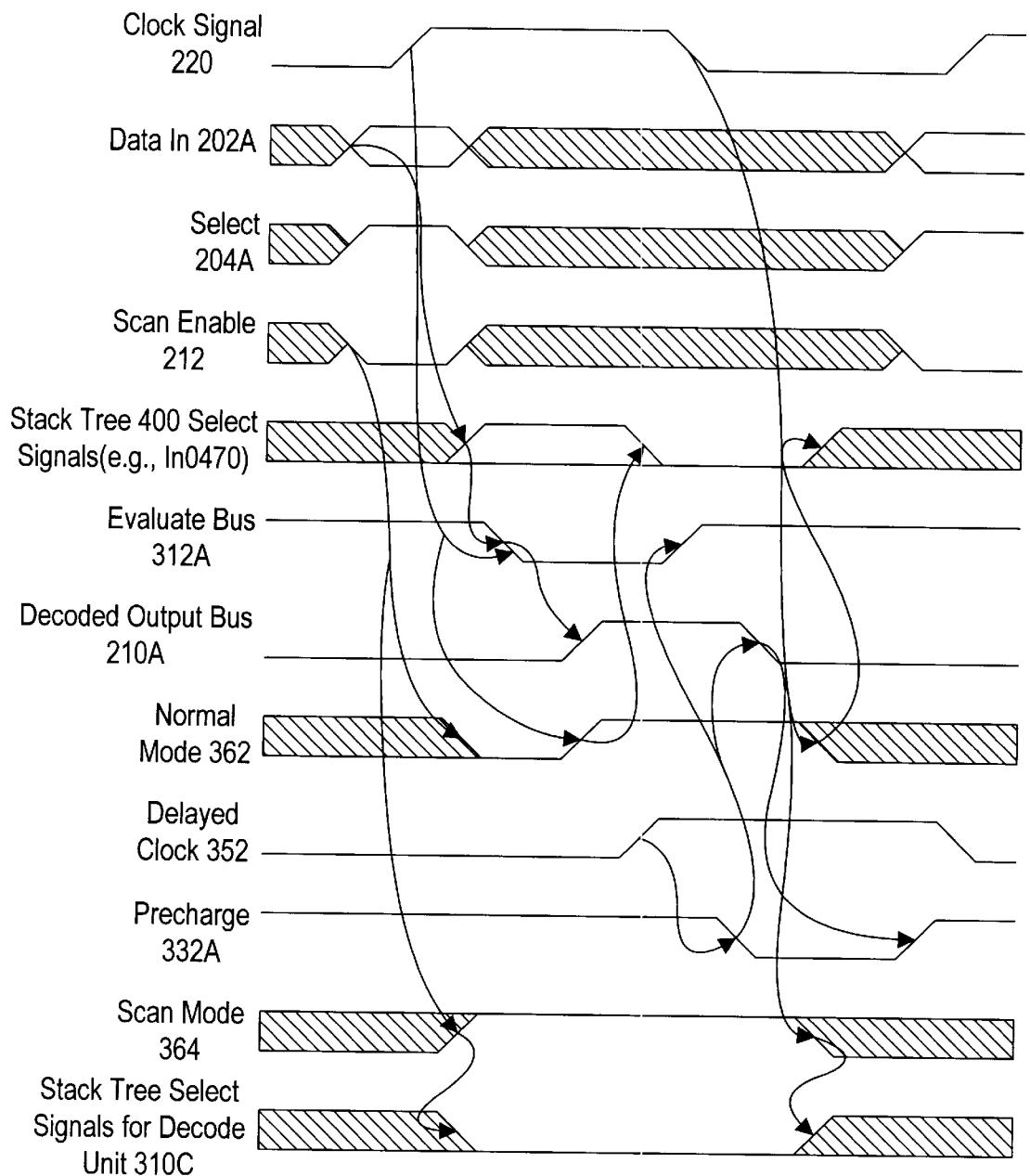
FIG. 9 is a timing diagram depicting operation of one embodiment of a decode register.

Turning now to FIG. 9, a timing diagram depicting operation of one implementation of a decode register is shown. FIG. 9 illustrates the operation of decode register 200 when scan enable signal 212 is de-asserted, data in signals 202A are all in a logic low state, and select signal 204A is active. Decode register 200 operates similarly when decode unit 310B is selected or scan enable 212 is asserted and the adr inputs to decode unit 310C are all in a logic low state.

Prior to a rising edge of clock signal 220, valid data in signals 202A, select signal 204A, and scan enable signal 212 are presented to decode register 200. When scan enable 212 becomes valid (as a logic low value in the example shown in FIG. 9), normal mode signal 362 transitions to a logic low state, and scan mode signal 364 transitions to a logic high state. Scan mode signal 364, de-asserted in the logic high state, causes the select signals (which activate the discharge transistors) for the stack tree in scan decode unit 310C to be inactive.

When the data in signals 202A to decode 310A become active, this transition causes select signals for stack tree 400 (such as in0 signal 470) to become valid. These select signals becoming valid, along with the rising edge of clock signal 220, causes evaluate bus signal 312A to discharge. Signal 312A is selectively discharged since all data in signals 202A are at a logic low state. The discharging of evaluate bus signal 312A causes a corresponding charging of decoded output bus signal 210A. The rising edge of clock signal 220 also causes normal mode signal 362 to be de-asserted. As described above, the de-assertion of normal mode signal 362 in response to the rising edge of clock signal 220 is delayed enough so that one of the signals of evaluate bus 312 may discharge before normal mode signal 362 becomes inactive (which inhibits discharging through decode units 310A–B).

Subsequent to the charging of decoded output bus 210A, the rising edge of delayed clock 352 occurs. This causes precharge signal 332A to be asserted, which precharges evaluate bus signals 312 (including signal 312A) and discharges decoded output bus 210 (including signal 210A), thus producing the falling edge of the output pulse of decode register 200. The discharging of decoded output bus signal 210A is employed to de-assert precharge signal 332A, as described above.

The falling edge of clock signal 220 causes both normal mode signal 362 and scan mode signal 364 to become invalid. In turn, the internal select signals for stack trees in decode units 310A–C become invalid. Decode register 200 is thus prepared for a subsequent access.

It is noted that although the scan logic described above has been discussed with reference to a decode register, the scan logic may also be employed in any type of circuit in which the outputs are mutually exclusive. For example, consider a logic block which receives a plurality of control signals from a control unit, each specifying a particular operation to the logic block. Since only one operation may be performed by the logic block at a time, only one control signal may be active at a time. The scan logic described herein may be employed to test the functionality of the control unit which drives the (mutually exclusive) control signals to the logic block.

Numerous variations and modifications will become apparent to those skilled in the art once the above disclosure is fully appreciated. It is intended that the following claims be interpreted to embrace all such variations and modifications.

What is claimed is:

1. A decode register, comprising:
a first decode unit which includes a first plurality of input lines and which is configured to convey a first decoded output value in response to a first input value being conveyed on said first plurality of input lines during a given clock cycle in which said decode register is operating in a normal mode;
a second decode unit which includes a second plurality of input lines and which is configured to convey a second decoded output value in response to a second input value being conveyed on said second plurality of input lines during a particular clock cycle in which said decode register is operating in a scan mode, wherein said second plurality of input lines includes a scan input line and one or more feedback lines each conveying a respective value, wherein said respective value of each of said one or more feedback lines corresponds to a previous respective value of another of said second plurality of input lines during a previous clock cycle;
an encoder configured to receive a decoded input value indicative of said second decoded output value, wherein said encoder is configured to generate an encoded output value corresponding to said decoded input value in response to receiving said decoded input value during said particular clock cycle, and wherein said encoded output value is conveyed on a scan output line and said one or more feedback lines.

2. The decode register as recited in claim 1, wherein said decode register further includes a scan enable input line for receiving a scan enable value.

3. The decode register as recited in claim 2, wherein said first decode unit is inhibited from generating said decoded output value if said scan enable value is active.

4. The decode register as recited in claim 2, wherein said second decode unit is inhibited from generating said decoded output value unless said scan enable value is active.

5. The decode register as recited in claim 1, wherein said decoded output value is conveyed on an evaluate bus comprising a first plurality of dynamic nodes.

6. The decode register as recited in claim 5, wherein each of said first plurality of dynamic nodes is charged to a first logic state during a precharge phase of said given clock cycle.

7. The decode register as recited in claim 6, wherein said first decode unit includes a first enable input line for receiving a first enable input value, wherein said first decode unit is inhibited from generating said decoded output value unless said first enable input value is active.

8. The decode register as recited in claim 7, wherein generation of said decoded output value during an evaluate phase of a clock cycle in which said first enable input value is active selectively discharges one of said first plurality of dynamic nodes to a second logic state.

9. The decode register as recited in claim 8, wherein said second decode unit includes a second enable input line for receiving a second enable input value, wherein said second decode unit is inhibited from generating said decoded output value unless said second enable input value is active.

10. The decode register as recited in claim 9, wherein generation of said decoded output value during an evaluate phase of a clock cycle in which said second enable input value is active selectively discharges one of said first plurality of dynamic nodes to said second logic state.

11. The decode register as recited in claim 10, further comprising a driver output unit coupled to said first plurality of dynamic nodes and a corresponding plurality of decode register output lines, wherein said corresponding plurality of decode register output lines are a second plurality of dynamic nodes.

12. The decode register as recited in claim 11, wherein said driver output unit is configured to selectively charge one of said second plurality of dynamic nodes to said first logic state in response to a corresponding one of said first plurality of dynamic nodes being discharged to said second logic state.

13. The decode register as recited in claim 12, wherein a value of said second plurality of dynamic nodes represents said decoded input value.

14. The decode register as recited in claim 13, wherein said decode register includes a clock input line for receiving a clock signal.

15. The decode register as recited in claim 14 further comprising a reset logic unit coupled to said corresponding plurality of decode register output lines, wherein said reset logic unit includes a delayed clock input line for receiving a delayed version of said clock signal.

16. The decode register as recited in claim 15 further comprising a clock delay unit which generates said delayed version of said clock signal in response to receiving said clock signal.

17. The decode register as recited in claim 16 wherein said reset logic unit is configured to generate a reset signal in response to receiving said delayed version of said clock signal during said evaluate phase of said clock cycle, wherein said reset signal is conveyed to first decode unit and said second decode unit.

18. The decode register as recited in claim 17 wherein said first decode unit and second decode unit are configured to charge each of said first plurality of dynamic nodes to said first logic state in response to receiving said reset signal.

19. The decode register as recited in claim 7 further comprising a third decode unit which includes a third plurality of input lines and a second enable input line, wherein said second enable line receives said second enable input value.

20. The decode register as recited in claim 19 wherein said third decode unit is configured to convey said decoded output value in response to said input value being conveyed on said third plurality of input lines during a clock cycle in which said decode register is operating in said normal mode, said first enable input value is inactive, and said second enable input value is active.

21. The decode register as recited in claim 20 wherein said first enable input value is activated in response to said scan mode being disabled and said first decode unit being selected by a first decode select signal, wherein said second enable input value is disabled when said first decode select signal is active.

22. The decode register as recited in claim 20 wherein said second enable input value is activated in response to said scan mode being disabled and said third decode unit being selected by a second decode select signal, wherein said first enable input value is disabled when said second decode select signal is active.

23. A circuit, comprising:

a logic unit which is coupled to a clock signal and a first plurality of input lines, wherein said logic unit is configured to convey a plurality of output values on a plurality of output lines in response to receiving an input value on said plurality of input lines during a given clock cycle in which said circuit is operating in a normal mode, and wherein only one of said plurality of output lines is asserted during said given clock cycle, and wherein said logic unit is further coupled to a second plurality of input lines, and wherein said logic unit is configured to convey a second plurality of output values on said plurality of output lines in response to a second input value being conveyed on said second plurality of input lines during a particular clock cycle in which said logic unit is operating in a scan mode, and wherein only one of said plurality of output lines is asserted during said particular clock cycle, and wherein said second plurality of input lines includes a scan input line and one or more feedback lines each conveying a respective value, wherein said respective value of each of said one or more feedback lines corresponds to a previous respective value of another of said second plurality of input lines during a previous clock cycle;

an encoder coupled to receive said second plurality of output values from said logic unit, wherein said encoder is configured to generate an encoded output value in response to receiving said second plurality of output values during said particular clock cycle, and wherein said encoded output value corresponds to said second input value, and wherein said encoded output value is conveyed on a scan output line and said one or more feedback lines.

* * * * *